(12) United States Patent
Jo et al.

(10) Patent No.: US 11,793,093 B2
(45) Date of Patent: Oct. 17, 2023

(54) RESISTIVE RANDOM ACCESS MEMORY AND FABRICATION TECHNIQUES

(71) Applicant: CROSSBAR, INC., Santa Clara, CA (US)

(72) Inventors: Sung-Hyun Jo, Sunnyvale, CA (US); Sundar Narayanan, Cupertino, CA (US); Zhen Gu, Cupertino, CA (US)

(73) Assignee: CROSSBAR, INC., Santa Clara, CA (US)

( * ) Notice: Subject to any disclaimer, the term of this patent is extended or adjusted under 35 U.S.C. 154(b) by 24 days.

(21) Appl. No.: 16/651,702

(22) PCT Filed: Oct. 1, 2018

(86) PCT No.: PCT/US2018/053780
§ 371 (c)(1),
(2) Date: Mar. 27, 2020

(87) PCT Pub. No.: WO2019/068094
PCT Pub. Date: Apr. 4, 2019

(65) Prior Publication Data
US 2020/0259081 A1    Aug. 13, 2020

Related U.S. Application Data

(60) Provisional application No. 62/566,154, filed on Sep. 29, 2017.

(51) Int. Cl.
*H10N 70/00* (2023.01)

(52) U.S. Cl.
CPC ......... *H10N 70/841* (2023.02); *H10N 70/021* (2023.02); *H10N 70/881* (2023.02)

(58) Field of Classification Search
CPC ................ H01L 45/1253; H01L 45/14; H01L 45/1608; H01L 45/145; H01L 27/2427;
(Continued)

(56) References Cited

U.S. PATENT DOCUMENTS 7,399,655 B2 * 7/2008 Dennison ............ H01L 27/2427
257/E27.004
8,995,170 B2 * 3/2015 Kawashima ........... H10B 63/80
365/158
(Continued)

FOREIGN PATENT DOCUMENTS

CN 102971848 3/2013
CN 103314410 9/2013
(Continued)

OTHER PUBLICATIONS

Office Action for corresponding Taiwan application dated Apr. 8, 2020, 10 pages long.
(Continued)

*Primary Examiner* — Allison Bernstein
(74) *Attorney, Agent, or Firm* — Wegman Hessler Valore (57) ABSTRACT

A self-aligned memory device includes a conductive bottom plug disposed within an insulating layer and having a coplanar top surface, a self-aligned planar bottom electrode disposed upon the coplanar top surface and having a thickness within a range of 50 Angstroms to 200 Angstroms, a planar switching material layer disposed upon the self-aligned planar bottom electrode, a planar active metal material layer disposed upon the planar switching material layer and a planar top electrode disposed above the planar active metal material layer, wherein the self-aligned planar bottom electrode, the planar switching material layer, the planar active metal material layer, and the planar top electrode form a pillar-like structure above the insulating layer.

20 Claims, 3 Drawing Sheets

(58) Field of Classification Search
CPC ............... H01L 45/1233; H01L 45/085; H01L 45/1266; H01L 45/1691; H10N 70/841; H10N 70/021; H10N 70/881; H10N 70/068; H10N 70/245; H10N 70/826; H10N 70/8416; H10N 70/883; H10B 63/24

See application file for complete search history.

(56) References Cited

U.S. PATENT DOCUMENTS

| | | | |
|---|---|---|---|
| 9,196,530 | B1 | 11/2015 | Tortorelli et al. |
| 9,741,765 | B1 | 8/2017 | Narayanan |
| 2005/0162881 | A1 | 7/2005 | Stasiak et al. |
| 2012/0261635 | A1* | 10/2012 | Zhou ............... H01L 45/1233 257/2 |
| 2015/0123072 | A1 | 5/2015 | Sekar et al. |
| 2015/0243886 | A1 | 8/2015 | Narayanan |
| 2015/0318333 | A1 | 11/2015 | Sundar |
| 2016/0268341 | A1 | 9/2016 | Narayanan et al. |
| 2017/0229646 | A1 | 8/2017 | Chou et al. |

FOREIGN PATENT DOCUMENTS

| | | |
|---|---|---|
| CN | 104835910 | 8/2015 |
| CN | 105047682 | 11/2015 |
| CN | 105118916 | 12/2015 |

OTHER PUBLICATIONS

Office Action for corresponding Chinese Patent Application No. 201880077559.0, dated Mar. 30, 2023, 32 pages long.

* cited by examiner

RESISTIVE RANDOM ACCESS MEMORY AND FABRICATION TECHNIQUES

CROSS-REFERENCE TO RELATED APPLICATIONS

The present application is a non-provisional application of, and claims priority to, non-provisional application No. 62/566,154 filed Sep. 29, 2017 and incorporates it by reference for all purposes.

TECHNICAL FIELD

The subject disclosure relates generally to non-volatile memory, and as one illustrative example, a non-volatile memory cell and fabrication methods.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments of the present invention describe advances in techniques for forming non-volatile memory devices, such as resistive random access memory (ReRAM) devices and for forming volatile memory devices, such as a selector device. In some embodiments, a non-volatile memory device is formed utilizing a technique that allows the memory device to be formed in self-aligned manner within a semiconductor fabrication process. More specifically, a conductive bottom electrode is provided on top of a bottom conductive plug, and then resistive switching device layers are formed on top of the conductive bottom electrode. The conductive bottom electrode typically has a low resistivity and may be formed from a conductive metal or metal compound. In various embodiments, the resistive switching device layers and the conductive bottom electrode are etched into a pillar structure. To reduce the amount of conductive residue that may adhere to sidewalls of the pillar structure as a result of the etch, multiple experiments were conducted where the thickness of the conductive bottom electrode was carefully controlled. With thicknesses larger than about 300 A, it has been discovered that conductive residue often results in non-functional resistive switching devices (pillars), and with thicknesses on the range of 50 to 200 Angstroms, 50 A to 100 A or the like, the conductive residue can be reduced, and the number of functioning resistive switching devices is greatly increased. In some embodiments, with thicknesses much thinner than 50 Angstroms, the conductivity of the conductive bottom electrode often decreases, and the self-aligned process advantage for forming the resistive switching device typically decreases.

According to one aspect of the invention, a self-aligned memory device is described. One device may include a conductive bottom plug structure disposed within an insulating layer, wherein the conductive bottom plug and a top surface of the insulating layer are substantially coplanar, and a self-aligned planar bottom electrode disposed upon the conductive bottom plug structure and upon at least a portion of the top surface of the insulating layer, wherein the self-aligned bottom electrode has a thickness within a range of 50 Angstroms to 200 Angstroms. A device may include a planar switching material layer disposed upon the self-aligned planar bottom electrode, a planar active metal material layer disposed upon the planar switching material layer, and a planar top electrode disposed above the planar active metal material layer. In one embodiment, the self-aligned planar bottom electrode, the planar switching material layer, the planar active metal material layer, and the planar top electrode form a pillar-like structure above the insulating layer.

According to another aspect of the invention, a self-aligned method for forming a memory device is disclosed. A technique may include forming insulating layer having a bottom interconnect, wherein a top surface of the bottom interconnect and a top surface of the insulating layer are substantially planar, and disposing a bottom electrode material layer upon at least a portion of the insulating layer in self-aligned contact with the top surface of the bottom interconnect. A process may include disposing a plurality of material layers upon the top surface of the bottom electrode material layer, wherein the plurality of material layers comprises a resistive switching material layer, an active metal layer, and a top electrode layer, and etching the plurality of material layers and the bottom electrode material layer to form a pillar structure, wherein the pillar structure comprises a resistive switching device.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

This disclosure relates to a device having a memory element. More specifically, the disclosure relates to a memory element and fabrication methods. In some embodiments, the memory element may be a resistive switching device based upon conductive metallic filaments.

This disclosure relates to a memory device comprising a non-volatile memory. In some embodiments, the non-volatile memory device can include a resistive two-terminal memory device that can be placed in different resistive states, such as a low resistive state, a high resistive state, an intermediate state, in response to respective voltages, or respective ranges of voltages, applied to the resistive two-terminal memory device. In some embodiments, the non-volatile memory device may be a resistive random access device under development by the assignee of the present invention. In some embodiments, the memory device can include a resistive two-terminal selector device that can be in a low resistive state or a high resistive state in response to respective voltages, or respective ranges of voltages, applied to the resistive two-terminal selector device. The selector device can be a volatile switching device with multiple thresholds (or narrow threshold ranges) (e.g., a positive threshold and a negative threshold). In various embodiments, the selector device is a resistive switching device, or a field induced superlinear threshold (FAST™) switching device (or selector device) under development by the assignee of the present invention.

Figure 1A:
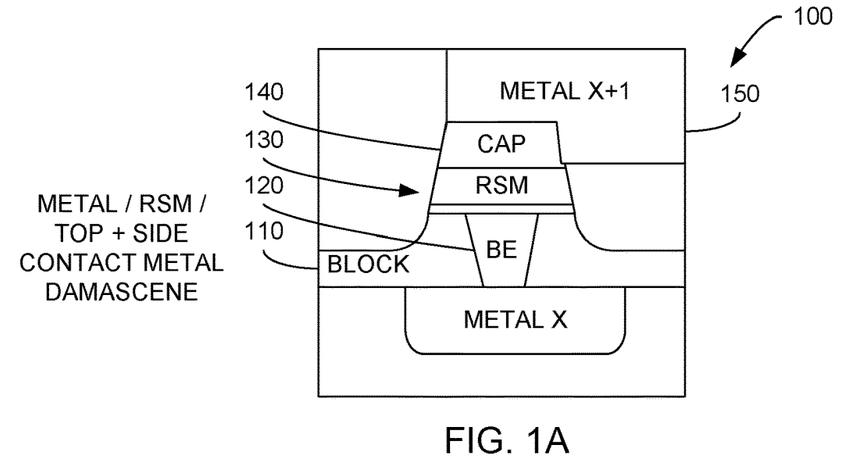
FIGS. 1A-C depict a cross-section diagram of some embodiments of the present invention.
Figure 1B:
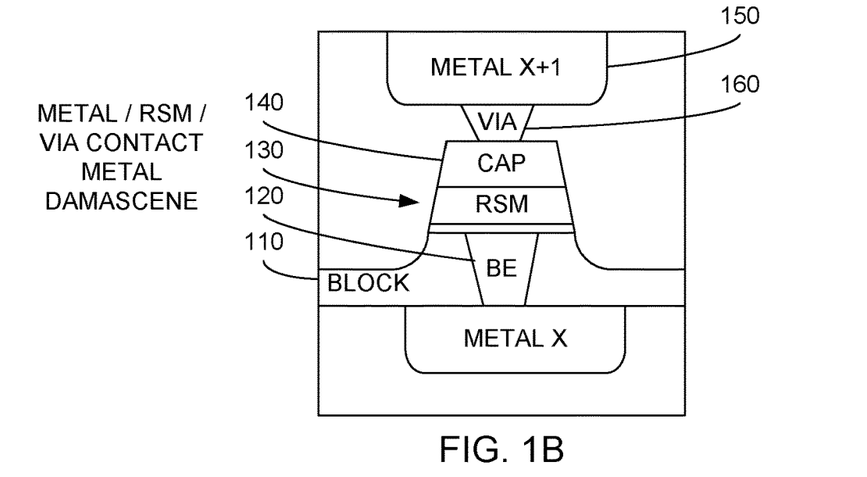
Figure 1C:
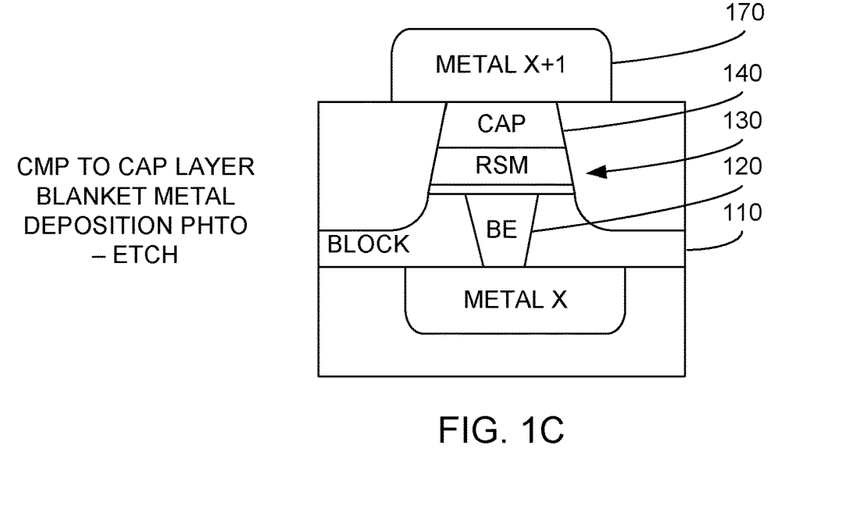

FIGS. 1A-C illustrate different embodiments of a memory device. Disclosed are successive back end metallization layers: Metal x and Metal x+1, formed of aluminum, copper, and/or one or more barrier materials, below Metal 1. In some embodiments, block layer 110 may be any appropriate non-conductive material layer, such as silicon nitride, silicon dioxide, barrier materials, or the like. In addition, BE 120 represents an electrically conductive bottom electrode material, such as TiN, W, or the like, as will be discussed below. A non-volatile memory 130, e.g. a resistive switching device (1R) is then provided, described further below. In some embodiments, a selector device (1S) (volatile switching device) may be stacked along with the resistive switching device (non-volatile switching device) to form a 1R1S configuration. Further details with regards to compositions of thereof are given below. Additionally, in various embodiments, Cap 140 represents an electrically conductive top electrode material such as TiN, TiN/W, or the like, having compressive stress, coupled to Metal x+1 layer. A conductive via may be used in some embodiments.

As can be seen in FIGS. 1A-C, various configurations and fabrication methods for representative memory device are disclosed. In some embodiments, an additional liner material may be disposed upon the cap, prior to deposition of Metal x+1. The liner may be an AlOx (stoichiometric or non-stoichiometric) material, similar to composition of the RSL material. In other embodiments, liner may be a silicon containing layer (e.g. SiOx, LTO, SiON, SiNx, nitrogen doped silicon carbide) formed by PVD or CVD, or the like.

In the example in FIG. 1A, a Metal x+1 layer 150 (in some embodiments, combined with a liner layer), is illustrated contacting the top and side of cap 140. For such embodiments, Metal x+1 layer may be formed by a damascene process. In the example in FIG. 1B, a conductive via 160 may be formed between cap 140 and metal x+1 150. Such embodiments may be useful where the distance between the metal layers is large, requires a redistribution layer, or the like. In the example in FIG. 1C, metal x+1 170 may be formed by a metal deposition, photolithography process, and etch back process. In these embodiments, resistive switching memory 130 may include a non-volatile device (1R) or a non-volatile device in addition to a volatile device (1RS).

Referring generally to the disclosed embodiments, two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having a pair of conductive contacts with an active region between the conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the conductive contacts. These electrical signals can be selected to have suitable characteristics, such as a voltage or current value, a voltage or current polarity, a field strength, a field polarity, or the like, or a suitable combination thereof. Examples of a resistive switching two-terminal memory device, though not exhaustive, can include a resistive random access memory (RRAM), a phase change RAM (PCRAM) and a magnetic RAM (MRAM).

Resistive switching memory described in the subject disclosure can include filamentary-based devices, in various embodiments, including, e.g., a non-volatile memory device 1R, a volatile selector device 1S, a combination of the foregoing 1R1S, or a similar device. Composition of filamentary-based devices can vary per device, with different components selected to achieve desired characteristics (e.g., volatility/non-volatility, on/off current ratio, switching time, read time, memory durability, program/erase cycle, and so on). One example of a filamentary-based device can comprise: a conductive layer (Bottom electrode), e.g., metal, doped p-type (or n-type) silicon (Si) bearing layer (e.g., a p-type or n-type Si bearing layer, p-type or n-type polysilicon, p-type or n-type polycrystalline SiGe, etc.), a resistive switching layer (RSL) and an active metal layer capable of being ionized. Under suitable conditions, the active metal layer can provide metal filament-forming ions to the RSL. In such embodiments, a conductive filament (e.g., formed by the metal ions) can facilitate electrical conductivity through at least a subset of the RSL, and a resistance of the filament-based device can be determined, as one example, by a tunneling resistance between the filament and the conductive layer.

Composition of filamentary-based devices can vary per device, with different components selected to achieve desired characteristics (e.g., volatility/non-volatility, on/off current ratio, switching time, read time, memory durability, program/erase cycle, and so on). One example of a filamentary-based device can comprise: a (phase vapor deposition, chemical vapor deposition or atomic layer deposition) conductive layer, e.g., metal, metal-alloy, metal-nitride, metal-subnitride, metal oxide, metal-suboxide (e.g., comprising TiN, TaN, TiW, W, WNx, WOy) (or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer.

A RSL (which can also be referred to in the art as a resistive switching media (RSM)) can comprise, e.g., an undoped amorphous Si-containing layer, a semiconductor layer having intrinsic characteristics, a silicon nitride (e.g., SiN, Si3N4, SiNx, etc.), a Si sub-oxide (e.g., SiOx wherein x has a value between 0.1 and 2), a Si sub-nitride, a metal oxide, a metal nitride, a non-stoichiometric silicon compound, and so forth. Other examples of materials suitable for the RSL could include SixGeyOz (where x, y and z are respective suitable positive numbers), a silicon oxide (e.g., SiON, where N is a suitable positive number), a silicon oxynitride, an undoped amorphous Si (a-Si), amorphous SiGe (a-SiGe), TaOB (where B is a suitable positive number), HfOC (where C is a suitable positive number), TiOD (where D is a suitable number), Al2OE (where E is a suitable positive number) and so forth, a nitride (e.g. AlN, SiN), or a suitable combination thereof. In some embodiments, the RSL does not intentionally include ionic dopants, although metallic and non-metallic particles, such as Ti, V, Ta, W, Hf, Ru, Pt, Pd, Cu, Si, N, may be provided therein.

In some embodiments, a RSL employed as part of a non-volatile memory device (non-volatile RSL) can include a relatively large number (e.g., compared to a volatile selector device) of material voids or defects to trap neutral metal particles (at least at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects. Because of the few particle-trapping voids/defects, a conductive filament formed in such an RSL can be quite thin, and unstable absent a suitably high external stimulus (e.g., an electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude. Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, nitrides, oxides, alloys, or combinations of the foregoing or similar materials can be employed for the active metal-containing layer in some aspects of the subject disclosure. Further, a non-stoichiometric compound, such as a non-stoichiometric metal oxide or metal nitride (e.g., AlOx, AlNx, CuOx, CuNx, AgOx, AgNx, and so forth, where x is a suitable positive number, (e.g. sub-oxide or sub-nitride 0<x<2, 0<x<1.5, 0<x<1) which can have differing values for differing ones of the non-stoichiometric compounds, or other suitable metal compound) can be employed for the active metal-containing layer, in at least one embodiment. In various embodiments, the active metal-containing layer is conductive with a resistance between about 10 Ohm/square to 10,000 Ohms/square. A metal-rich sub-oxide or sub-nitride may be used in some embodiments. In some embodiments a rapid thermal anneal of less than 350 C may be used for a back end of the line process.

In one or more embodiments, a disclosed filamentary resistive switching device can include an active metal layer comprising a non-stoichiometric metal nitride selected from the group consisting of: TiNx, TaNx, AlNx, CuNx, WNx and AgNx, where x is a positive number. In a further embodiment(s), the active metal layer can comprise a non-stoichiometric metal oxide selected from the group consisting of: TiOx, TaOx, AlOx, CuOx, WOx and AgOx. In yet another embodiment(s), the active metal layer can comprise a non-stoichiometric metal oxi-nitride selected from the group consisting of: TiOaNb, AlOaNb, CuOaNb, WOaNb and AgOaNb, where a and b are positive numbers. The disclosed filamentary resistive switching device can further comprise a switching layer comprising a switching material selected from the group consisting of: SiOy, AlNy, TiOy, TaOy, AlOy, CuOy, TiNx, TiNy, TaNx, TaNy, SiOx, SiNy, AlNx, CuNx, CuNy, AgNx, AgNy, TiOx, TaOx, AlOx, CuOx, AgOx, and AgOy, where x and y are positive numbers, and y is larger than x. Various combinations of the above are envisioned and contemplated within the scope of embodiments of the present invention. The stress (e.g. compressive, tensile) may also be adjusted relative to the stress of the RSL material to improve performance. In one embodiment, the active metal layer may be compressive.

In one example, a disclosed filamentary resistive switching device comprises a particle donor layer (e.g., the active metal-containing layer) comprising a metal compound and a resistive switching layer. In one alternative embodiment of this example, the particle donor layer comprises a metal-richer non-stoichiometric metal nitride: MNx, e.g., AgNx, TiNx, AlNx, etc., and the resistive switching layer comprises a metal-poorer non-stoichiometric metal nitride or metal oxide: MNy, e.g., AgOy, TiOy, AlOy, and so forth, where y and x are positive numbers, and in some cases y is larger than x. In an alternative embodiment of this example, the particle donor layer comprises a metal-richer non-stoichiometric metal oxide: MOx, e.g., AgOx, TiOx, AlOx, and so on, and the resistive switching layer comprises a metal-poorer non-stoichiometric metal oxide: MOy, e.g., AgOy, TiOy, AlOy, or the like, where y and x are positive numbers, and in some cases y is larger than x. In yet another alternative, the metal compound of the particle donor layer is a metal-richer non-stoichiometric metal nitride MNx (e.g., AgNx, TiNx, AlNx, etc.), and the resistive switching layer is selected from a group consisting of a metal-poorer non-stoichiometric metal oxide MOy (e.g., AgOx, TiOx, AlOx, etc.) and SiOy, where x and y are typically non-stoichiometric values, or vice versa in a still further embodiment.

As utilized herein, variables x, y and so forth representative of values or ratios of one element with respect to another (or others) in a compound can have different values suitable for respective compounds, and are not intended to denote a same or similar value or ratio among the compounds. In some embodiments, the stress (e.g. tensile, compressive) of the RSL may be tuned. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, and the following U.S. patent application assigned to the assignee of the present application for patent:

application Ser. No. 14/588,185 filed Dec. 31, 2014; each of the foregoing patent applications are hereby incorporated by reference herein in their respective entireties and for all purposes.

In various disclosed embodiments, filamentary-based switching devices are disclosed and their operation is described. In some embodiments, a filamentary-based switching device "1S" can be a volatile switching device, which exhibits a first measurably distinct state in the absence of a suitable external stimulus (or stimuli), and exhibits a second measurably distinct state in response to the suitable external stimulus (or stimuli). The volatile filamentary-based switching device is often referred to herein as a selector device, or selection device, filamentary selector device, filamentary-based selector device, a volatile switching device, a volatile two-terminal switching device, a volatile resistance-switching device, and so on; though such devices, their composition or application should not be limited by this terminology. In various embodiments, a filamentary selector device is provided in a circuit to facilitate formation of a non-volatile memory cell, having very fast performance. In some embodiments, the non-volatile memory cell can have a read performance less than 20 nanoseconds (ns), less than 10 nanoseconds, or between 1 ns and 5 ns, in various embodiments. In various embodiments, a FAST™ selector device under development by the current assignee is to be used.

A filamentary selector device according to various disclosed embodiments can exhibit a first state (e.g., a first electrical resistance, or other suitable measurable characteristic) in the absence of a suitable external stimulus (or stimuli). The stimulus (or stimuli) can have a threshold value or range of such values that induces the filamentary selector device to change from the first state to a second state while the stimulus is applied. In response to the stimulus falling below the threshold value (or outside of the threshold range of values) the filamentary selector device returns to the first state. In some disclosed embodiments, a filamentary based selector device can operate in a bipolar fashion, behaving differently in response to different polarity (or direction, energy flow, energy source orientation, etc.) external stimuli. As an illustrative example, in response to a first polarity stimulus exceeding a first threshold voltage (or set of voltages), the filamentary selector device can change to the second state from the first state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), or switching in response to the same or similar magnitude of threshold stimulus, or range thereof, (though of opposite polarity or direction), or the like. In other embodiments, the third state can be distinct from the second state, either in terms of the measurable characteristic (e.g., different reverse electrical conductivity value in response to the reverse polarity as compared to a forward electrical conductivity value in response to the forward polarity) or in terms of threshold stimulus associated with transitioning out of the first state (e.g., a different magnitude of positive voltage required to transition to the second state, compared to a magnitude of negative voltage required to transition to the third state).

In other embodiments, the selector device may be a unipolar device, having a single threshold voltage. When an applied voltage, at least between ground and the threshold voltage is applied, the selector device has a high characteristic resistance. Further, when the applied voltage has a magnitude greater than the threshold voltage (e.g. more positive than a positive threshold voltage, or more negative than a negative threshold voltage), the selector device has a low characteristic resistance. In some embodiments, two unipolar devices may be placed in parallel, with opposite polarity. It is expected that such a configuration of unipolar devices would provide a characteristic response similar to the bipolar selector device, described above.

As stated above, a disclosed filamentary based selector device can form a conductive path or filament through a relatively high resistive portion in response to a suitable external stimulus (or range of stimulus). The external stimulus (or stimuli) can cause metallic particles within a terminal of the selector device (e.g., active metal layer terminal, conductive layer terminal, etc.) to migrate within (or ionize within) a RSL layer of the filamentary selector device. Further, the RSL can be selected to have relatively few physical defect locations for the volatile filamentary switching device, facilitating relatively good mobility of the metallic particles within the RSL, formation of a very narrow (e.g., only a few particles wide, or less) conductive filament, or the like, or a combination of the foregoing. Accordingly, with respect to a forward direction and positive polarity stimulus, below an associated positive threshold stimulus (or narrow range of positive threshold values), the metallic particles can disperse within the RSL, resisting or avoiding formation of a sufficient conductive path through the RSL to lower a high resistance associated with the first state. Above the threshold, the external stimulus maintains (or forms) the metallic particles in sufficient formation to provide the conductive path, leading to relatively low resistance of the second state. An analogous mechanism can control operation of the third state (in a reverse direction and reverse polarity stimulus) in the bipolar context. In various embodiments, volatile resistive switch may be embodied as a FAST™ selector device, currently under development by the current assignee of the present patent application and disclosed in U.S. Non-Provisional application Ser. No. 14/588, 185 filed Dec. 31, 2014, the entirety of which is incorporated by reference herein for all purposes.

Examples of suitable materials for the top electrode or bottom electrode of volatile resistive switch "1S" can include a noble metal (e.g., Ag, Pd, Pt, Au, etc.) or a metal alloy containing noble metal in part (e.g., Ag—Al, Ag—Pd—Cu, Ag—W, Ag—Ti, Ag—TiN, Ag—TaN, and so forth, as described above or elsewhere herein). A noble metal or alloy thereof can be utilized to facilitate mitigated interaction between the top electrode or the bottom electrode and a selector layer of volatile resistive switch, situated between the top electrode and the bottom electrode, for instance. This mitigated particle interaction (e.g., mitigating or avoiding chemical bonding of the top electrode particles or the bottom electrode particles with particles of the selector layer of volatile resistive switch) can facilitate improved longevity and reliability for volatile resistive switch, as one example. Another example of a suitable material for the top electrode or the bottom electrode can include a material with relatively fast diffusing particles. Faster diffusion can include, for instance, a capacity to move among defect sites (e.g., voids or gaps in molecular material) within a solid, e.g., defined by a suitable surface energy, facilitating dispersion of the relatively fast diffusion particles absent a suitable aggregating force, for instance (e.g., an external voltage of greater than a threshold magnitude). Materials with relatively fast diffusing particles can facilitate fast state switching of volatile resistive switch "1S" (e.g., from a non-conductive state to a conductive state), at lower bias values. Examples of suitable fast diffusing materials can include Ag, Cu, Au, Co, Ni, Al, Fe, or the like, suitable alloys thereof, or suitable combinations of the foregoing.

In at least one embodiment, the top electrode of volatile resistive switch can be comprised of the same material or substantially the same material as the bottom electrode of volatile resistive switch. In other embodiments, the top electrode and bottom electrode can be different materials. In still other embodiments, the top electrode and bottom electrode can be at least in part the same material, and in part different materials. For instance, the top electrode could comprise a suitable conductive material, and the bottom electrode could at least in part comprise an alloy of the suitable conductive material, or the suitable conductive material in combination with another suitable conductor, as an illustrative example.

In addition to the foregoing, volatile resistive switch includes a selector device disposed between the top electrode and the bottom electrode of volatile resistive switch. In contrast to top electrode or bottom electrode, however, the selector device can be an electrical insulator or ionic conductor. Further, the selector device can include a material (e.g., an oxide, a sub-oxide, etc.) at least weakly permeable to particles of the top electrode or bottom electrode. In some embodiments, the selector layer can be a non-stoichiometric material. In such embodiments suitable materials for selector layer can include, e.g., non-stoichiometric materials of: SiOx, AlOx, WOx, TixNyOz, HfOx, TaOx, NbOx, or the like, or suitable combinations thereof, where x, y and z can be suitable non-stoichiometric values. As a particular non-limiting example, the selector layer can be SiOx where x is between about 0.1 and about 2. In some embodiments, the selector layer can be a (doped or undoped) chalcogenide or a solid-electrolyte material containing one or more of Ge, Sb, S, Te. In yet another embodiment, the selector material can comprise a stack of a plurality of the above mentioned materials (e.g. SiOx/GeTe, TiOx/AlOx, and so forth). In at least one embodiment of the present disclosure, the selector layer can be doped with a metal(s) during fabrication, to facilitate metal ion injection from the top or bottom electrode.

In response to a suitable signal applied at non-volatile memory cell 100, volatile resistive switch can transition from a non-conducting state having a high electrical resistance and a first current (or a first range of currents), to a relatively-conducting state having a lower electrical resistance and a second current (or a second range of currents). In various embodiments, a current ratio of the first current(s) to the second current(s) can be at least about 1,000 or more. For instance, in one embodiment, the current ratio can be selected from a range of current ratios from about 1,000 to about 10,000. In another embodiment, the current ratio can be selected from a range of current ratios from about 10,000 to about 100,000. In yet another embodiment, the current ratio can be selected from a range of current ratios from about 100,000 to about 1,000,000. In still other embodiments, the current ratio can be selected from a range of current ratios from about 1,000,000 to about 10,000,000 or more. In a further embodiment, the current ratio can be within a range of current ratios from about 10E9 to about 10E11. Other suitable current ratios can be provided for a volatile resistive switch in various other suitable embodiments. It is expected with further research, current ratios of up to 10E15 or 10E18 may be obtainable.

Figure 2:
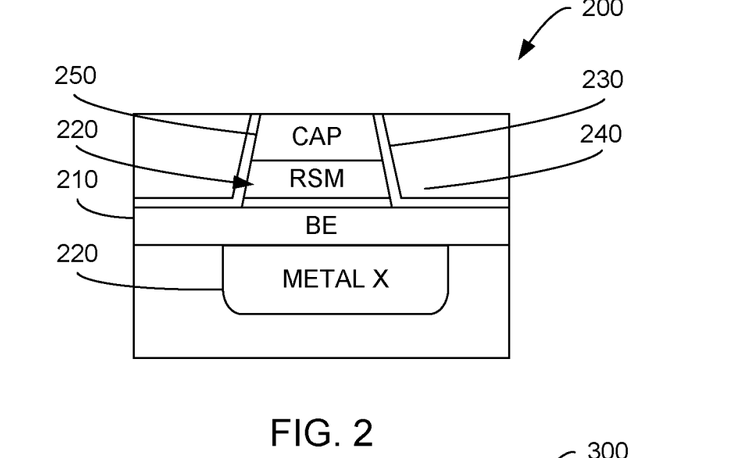
FIG. 2 depicts a fabrication method according to various embodiments of the present invention.

FIG. 2 illustrates another embodiment of the present invention. In various embodiments, multiple techniques may be used for formation of the memory device 200 in a 1R configuration. In one case, the bottom electrode (BE) 210 is not formed as a pillar, but a planar structure upon metal x 220. The RSL, active metal, and top electrode (TE) are deposited, and then etched to form a pillar. After formation of the pillar, a liner material 230 and an insulator material 240 may be deposited, and the structure may then be planarized to expose the top electrode 250. In the example shown, the BE may be a planar layer.

Figure 3:
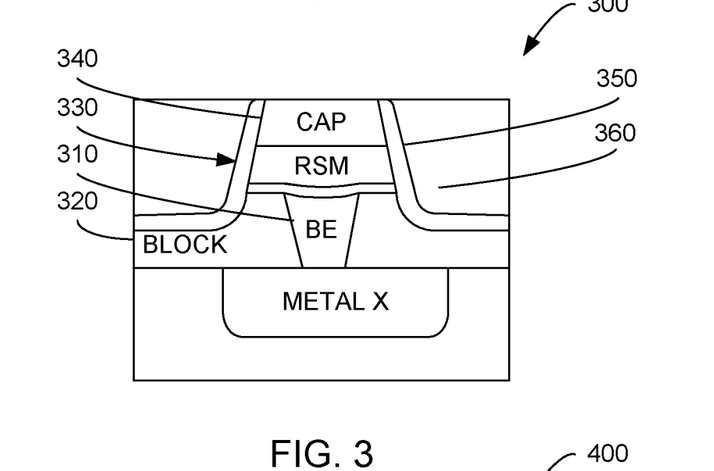
FIG. 3 depicts a fabrication method according to various embodiments of the present invention.

FIG. 3 illustrates another embodiment of the present invention. In another case, the BE 310 of memory device 300 may be formed with a damascene process, where a via is formed in the block layer 320, and the via is filled with a BE material. The structure is then planarized to expose the top portion of the BE material. Subsequently, the RSL 330, active metal material layer, and TE material 340 are deposited, and then etched to form a pillar. As illustrated, the pillar etch may partially extend into the block layer 320. After formation of the pillar, a liner material 350 and an insulator material 360 may be deposited, and the structure may then be planarized to expose the top electrode.

Figure 4:
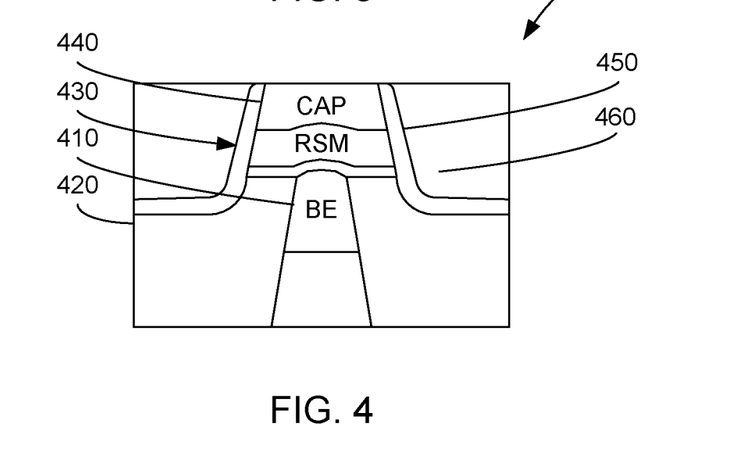
FIG. 4 depicts a fabrication method according to various embodiments of the present invention.

FIG. 4 illustrates another example of the present invention. In this embodiment, the BE material 410 of memory device 400 is deposited and is then patterned as a pillar or line from one or more materials. The block layer (e.g. dielectric, tan) 420 is then deposited over the BE 410 pillar, then the dielectric is etched to expose the top of the BE material. The RSL and active metal 430, and top electrode (TE) 440 are then deposited, and then etched to form a pillar. As illustrated, the pillar etch may partially extend into the block layer 420. After formation of the pillar, a liner material 450 and an insulator material 460 may be deposited, and the structure may then be planarized to expose the top electrode.

Figure 5:
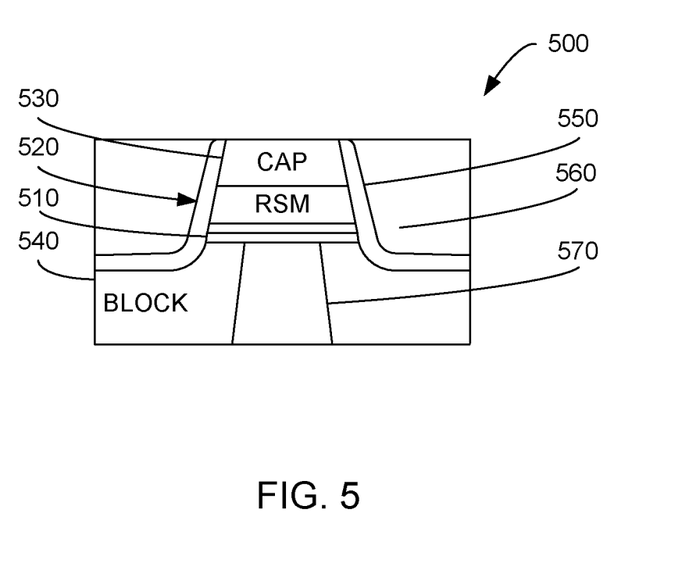
FIG. 5 depicts a fabrication method according to various embodiments of the present invention.

FIG. 5 illustrates another embodiment of the present invention. In yet another embodiment, the BE material 510, the RSL and active metal material layer 520, and TE material 530 are all deposited, and then all of the materials are etched to form a pillar. In these embodiments, all of the materials may be deposited using the same processing chamber, without air break. In some embodiments, the black layer BE 510 comprises a conductive metal-containing material similar to the top electrode, such as tungsten. The thickness of such a layer is within a range of 50 to 250 Angstroms, 50 to 100 Angstroms, or the like.

As illustrated, a pillar etch may etch the BE material 510, the RSL and active metal 520, and TE material 530 and may partially extend into the block layer 540. In various embodiments, the pillar etch may be a combination of one or more physical and/or chemical etches. Based upon various experiments, it has been discovered that thicknesses of the BE material 510 of larger than 250 A, BE material 510 tends to redeposit a residue upon the sidewalls of the pillars. This residue tends to be conductive, thus detrimental to memory device performance. Thicknesses less than about 50 Angstroms tend to be less conductive than larger thickness BE material 510, therefore reducing the benefits of the self-aligned capability described above. After formation of the pillar, a liner material 550 and an insulator material 560 may be deposited, and the structure may then be planarized to expose the top electrode.

In this example, the pillar is formed on top of a bottom plug 570 formed of another metal-containing material, such as Ti, TiN, or the like (using a damascene process or etch and fill process). Because the BE 510 is a metal-containing conducting layer, the alignment of the pillar with respect to the bottom plug 570 is not critical, thus the pillar is formed in a self-aligned manner.

In the above embodiments, the width of the pillar may approach the critical dimensions of the respective processing nodes.

In various embodiments, methods for forming the disclosed structures are expressly disclosed. To one of ordinary skill in the art, other non-expressly disclosed fabrication processes are known.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

In other embodiments, combinations or sub-combinations of the above disclosed invention can be advantageously made. For example, the embodiments described in the figures may be 1R devices, including a resistive switching material and an active metal layer forming a non-volatile switching device; the embodiments may be 1RS devices, including a non-volatile switching device (e.g. see above), in combination with a resistive switching material disposed between active metal layers forming a volatile switching device; and the like. In other examples, a plug structure, a via structure, or the like as illustrated in FIGS. 1A-C may be used for any of the embodiments illustrated in FIGS. 2-5 for connection to an upper metal layer. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A self-aligned memory device comprises:
   a conductive bottom plug structure disposed within an insulating layer, wherein a top surface of the conductive bottom plug and a top surface of the insulating layer are substantially coplanar;
   a self-aligned planar bottom electrode disposed upon the conductive bottom plug structure and upon at least a portion of the top surface of the insulating layer, wherein the self-aligned bottom electrode has a thickness within a range of 50 Angstroms to 200 Angstroms, wherein a width of the conductive bottom plug structure is less than a width of the self-aligned planar bottom electrode;
   a planar switching material layer disposed upon the self-aligned planar bottom electrode;
   a planar active metal material layer disposed upon the planar switching material layer;
   a planar top electrode disposed above the planar active metal material layer; and
   etching with a pillar etch the following materials: the self-aligned planar bottom electrode, the planar switching material layer, the planar active metal material layer, and the planar top electrode to form a pillar-like structure above the insulating layer.

2. The self-aligned memory device of claim 1 wherein a material for the self-aligned planar bottom electrode is selected from a group consisting of: metal, metal-alloy, metal-nitride, metal-subnitride, metal oxide, metal-suboxide, TiN, W, WNx, WOy, wherein x and y are non-stoichiometric values.

3. The self-aligned memory device of claim 1 wherein a switching material for the planar switching material layer comprises a non-stoichiometric material selected from a group consisting of: SiOy, AlNy, TiOy, TaOy, AlOy, CuOy, TiNx, TiNy, TaNx, TaNy, SiOx, SiNy, AlNx, CuNx, CuNy, AgNx, AgNy, TiOx, TaOx, AlOx, CuOx, AgOx, and AgOy, where x and y are non-stoichiometric positive numbers.

4. The self-aligned memory device of claim 3 wherein a material for the planar active metal material layer comprises a material selected from a group consisting of: a non-stoichiometric metal nitride, TiNx, TaNx, AlNx, CuNx, WNx and AgNx, a non-stoichiometric metal oxide, TiOx, TaOx, AlOx, CuOx, WOx and AgOx, a non-stoichiometric metal oxi-nitride TiOaNb, AlOaNb, CuOaNb, WOaNb, and AgOaNb.

5. The self-aligned memory device of claim 1 wherein the conductive bottom plug structure comprises a material selected from a group consisting of: a metal-based material, Ti, and TiN.

6. The self-aligned memory device of claim 1 wherein a material for the planar top electrode is selected from a group consisting of: TiN, TiN/W, W.

7. The self-aligned memory device of claim 1 further comprising a top electrode liner disposed upon sidewalls of the pillar-like structure, wherein a material for the top electrode liner is selected from a group consisting of: a non-stoichiometric metal oxide, AlOx, SiOx, LTO, SiON, SiNx, and nitrogen doped silicon carbide.

8. The self-aligned memory device of claim 1 further comprising:
a planar selector device disposed between the self-aligned planar bottom electrode and the planar switching material or disposed between the planar active metal material layer and the planar top electrode.

9. The self-aligned memory device of claim 8 wherein the selector device comprises:
a first planar electrode comprising a first metal material;
a second planar electrode comprising a second metal material; and
a planar volatile switching material layer disposed between the first planar electrode and the second planar electrode, wherein the planar volatile switching material layer is configured to receive metal particles from the first metal material under a voltage bias applied across the first electrode and the second electrode, to thereby modify a resistance of the planar volatile switching material.

10. The self-aligned memory device of claim 9 wherein the first metal material comprises material selected from a group consisting of: a noble metal, Ag, Pd, Pt, Au, a metal alloy containing noble metal in part, Ag—Al, Ag—Pd—Cu, Ag—W, Ag—Ti, Ag—TiN, Ag—TaN, and Ag—Si.

11. A self-aligned method for forming a memory device comprises:
forming an insulating layer having a bottom interconnect, wherein a top surface of the bottom interconnect and a top surface of the insulating layer are substantially planar;
disposing a bottom electrode material layer upon at least a portion of the insulating layer in self-aligned contact with the top surface of the bottom interconnect, wherein the bottom electrode material is a conductive metal-containing material having a thickness in a range from 50 Angstroms to 250 Angstroms;
disposing a plurality of material layers upon the top surface of the bottom electrode material layer, wherein the plurality of material layers comprises a resistive switching material layer, an active metal layer, and a top electrode layer; and
etching with a pillar etch the following: the plurality of material layers and the bottom electrode material layer to form a pillar structure, wherein the pillar structure comprises a resistive switching device.

12. The method of claim 11 further comprising:
disposing one or more insulating layers upon the pillar structure; and
exposing at least a portion of a top surface the top electrode layer through the one or more insulating layers.

13. The method of claim 12
wherein the exposing at least the portion of the top surface of the electrode comprises exposing at least a portion of a side surface of the top electrode layer: and
forming a conductive layer in contact with at least the portion of the top surface of the top electrode or a portion of the side surface of the top electrode.

14. The method of claim 12 wherein the exposing at least the portion of the top surface of the top electrode layer comprises etching a via within the one or more insulating layers to expose at least the portion of the top surface of the top electrode layer: and
disposing a conductive material within the via to contact the portion of the top electrode.

15. The method of claim 14 wherein the method further comprises forming a conductive material within the via by a damascene process.

16. The method of claim 15 wherein the conductive material comprises: a copper material and a conductive material and a liner material selected from a group consisting of: Ti, TiN, TaN, and W.

17. The method of claim 11 wherein the active metal layer includes a material selected from a group consisting of: a non-stoichiometric metallic nitride, a non-stoichiometric metallic oxide, silver (Ag), gold (Au), titanium (Ti), titanium-nitride (TiN), titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), palladium (Pd) or suitable compounds of one or more of the material described above.

18. The method of claim 11 wherein the resistive switching material is selected from a group consisting of: a non-stoichiometric metallic nitride, a non-stoichiometric metallic oxide, SiOy, AlNy, TiOy, TaOy, AlOy, CuOy, TiNx, TiNy, TaNx, TaNy, SiOx, SiNy, AlNx, CuNx, CuNy, AgNx, AgNy, TiOx, TaOx, AlOx, CuOx, AgOx, and AgOy, wherein x and y are non-stoichiometric values.

19. The method of claim 11, wherein disposing the bottom electrode material layer and disposing the plurality of material layers further comprises depositing the bottom electrode material layer and depositing the plurality of material layers using a single processing chamber without air break.

20. The method of claim 11, wherein etching the pillar etch comprises utilizing one or more physical or chemical etches.

* * * * *